US 6,518,607 B2

(12) United States Patent
Hynecek

(10) Patent No.: US 6,518,607 B2
(45) Date of Patent: Feb. 11, 2003

(54) LOW FEED THROUGH-HIGH DYNAMIC RANGE CHARGE DETECTION USING TRANSISTOR PUNCH THROUGH RESET

(75) Inventor: Jaroslav Hynecek, Richardson, TX (US)

(73) Assignee: Isetex, Inc., Allen, TX (US)

(*) Notice: Subject to any disclaimer, the term of this patent is extended or adjusted under 35 U.S.C. 154(b) by 59 days.

(21) Appl. No.: 09/874,033

(22) Filed: Jun. 6, 2001

(65) Prior Publication Data

US 2002/0017646 A1 Feb. 14, 2002

Related U.S. Application Data

(60) Provisional application No. 60/222,020, filed on Jul. 31, 2000.

(51) Int. Cl.[7] .................................. H01L 27/148
(52) U.S. Cl. .................... 257/239; 257/229; 257/249
(58) Field of Search .................... 257/223, 229, 257/239, 249, 234

(56) References Cited

U.S. PATENT DOCUMENTS 3,781,574 A * 12/1973 White et al. ............... 327/284
5,491,354 A * 2/1996 Hynecek ................... 257/239
5,726,710 A * 3/1998 Hynecek ................... 348/311

* cited by examiner

Primary Examiner—Minh Loan Tran
(74) Attorney, Agent, or Firm—John E. Vandigriff

(57) ABSTRACT

A new High Dynamic Range charge detection concept useful for CCD and Active Pixel CMOS image sensors uses at least one transistor operating in a punch through mode for the charge detection node reset. The punch through operation significantly reduces the reset feed through which leads to a higher voltage swing available on the node for the signal. This in turn allows building smaller and thus more sensitive charge detection nodes. The undesirabe artifacts, associated with the incomplete reset that are induced by the punch through operation, are completely removed by incorporating the CDS signal processing method into the signal processing chain. The incomplete reset artifact removal by the CDS technique is extended to all other resetting concepts that are modeled by a large reset time constant. The punch through concept is suitable for resetting Floating Diffusion charge detection nodes as well as Floating Gate charge detection nodes.

14 Claims, 6 Drawing Sheets

LOW FEED THROUGH-HIGH DYNAMIC RANGE CHARGE DETECTION USING TRANSISTOR PUNCH THROUGH RESET

This application claims the benefit of Provisional Application No. 60/222,020, filed Jul. 31, 2000.

FIELD OF THE INVENTION

The present invention relates to CCD and CMOS image sensors, and specifically to charge detection circuits for the CCD image sensors that have high Dynamic Range (DR) and low reset feed through.

BACKGROUND OF THE INVENTION

A typical image sensor senses light by converting impinging photons into electrons that are integrated (collected) in the sensor pixels. After the integration cycle is completed, charge is converted into a voltage that is supplied to the output terminals of the sensor. The charge to voltage conversion is accomplished either directly in the sensor pixels, such as in the Active Pixel CMOS sensors, or remotely off the sensing area, in charge conversion amplifiers. The most popular circuit used in these amplifiers consists of a Floating Diffusion (FD) charge detection node coupled to a source follower and reset by a reset transistor to a suitable reference voltage. The detail description of such an amplifier can be found for example in the book: "Solid-State Imaging with Charge-Coupled Devices" by Albert J. P. Theuwissen pp. 76–79, published in 1995 by Kluwer Academic Publishers.

The FD charge detection concept has many advantages such as simplicity of design, simplicity of operation, high charge to voltage conversion factor, and a well-established technology know how. However, the two main disadvantages are kTC noise and a large reset feed through. kTC noise has been significantly reduced over the years by developing the Correlated Double Sampling (CDS) signal processing technique, but not much progress has been made to date with the reset feed through problem. The reset feed through results from a capacitive coupling of the reset gate to the FD charge detection node. The reset gate must be pulsed with a relatively large pulse to remove charge from the node after sensing and this introduces an undesirable pulse into the output signal. The problem is further exacerbated by the recent demands for large charge conversion factors that necessitate reduction in the overall FD node capacitance. Since it is difficult to correspondingly reduce the FD node to reset gate capacitive coupling, the minimum value has already been reached, the over all node capacitance to the coupling capacitance ratio thus becomes much worse. A poor ratio of these capacitances then increases the feed through and as a result significantly reduces the useful voltage swing that can be allocated for the signal. It is therefore desirable to develop a new method for resetting the FD charge detection node that does not introduce the large reset feed through. By developing such a method, it is then possible to significantly increase the charge conversion sensitivity, and, at the same time, allocate a larger voltage swing for the signal resulting in higher Dynamic Range.

The present invention achieves high dynamic range readout capability. The prior art does not show how to use the Transistor Punch Through (TPT)concept for the Floating Diffusion, or Floating Gate CCD well reset, or how to design the reset circuit that has a small reset feed through and as a consequence high DR. The prior art does not teach that the incomplete reset caused by the charge flow over the barrier in the TPT reset concept when applied to the FD node can be reduced to an undetectable minimum by incorporating the CDS signal processing technique. The prior art does not teach that the reset circuit time constant in standard FD charge detection node can be comparable to the reset time period.

SUMMARY OF THE INVENTION

The invention is based on a Transistor Punch Through (TPT) concept that is used for resetting the Floating Diffusion (FD) or the Floating Gate (FG) charge detection nodes instead of the more conventional transistor gate resets. The incorporation of the TPT concept leads to an increase in the maximum voltage swing that is permissible on the FD and FG charge detection nodes by reducing the reset gate pulse capacitive coupling to the node. The undesirable effects of incomplete reset, inherent in the TPT concept used with the FD, are reduced to an undetectable minimum by using the well-known Correlated Double Sampling (CDS) signal processing technique.

The present invention provides a practical high DR charge detection node that has a small reset feed through, and provides a practical high performance low reset feed through charge detection circuit that uses Correlated Double Sampling to minimize the unwanted effects of incomplete reset. These features are achieved by replacing the conventional reset transistor, typically used in the standard Floating Diffusion charge detection nodes, with a Transistor that operates in a Punch Through mode. In the TPT reset mode of operation, the reset pulses are not applied to the transistor gate, but are applied to the transistor drain, while the gate is held at a suitable DC bias, preferably ground. This feature provides an efficient shielding and decoupling of the reset pulses from the FD or FG node. The transistor drain may also serve as an Output Diode (OD) to collect charge from the CCD register.

In another embodiment of the present invention, the TPT reset transistor structure has a dual gate. The gate adjacent to the FD node is short and held at a suitable DC bias. The reset pulses are applied to the second larger gate, which causes the potential under the short gate to also rise, which further causes reset by removing charge from the FD node. The drain in this structure is biased at a large DC bias such as Vdd. Since charge in both of these embodiments is removed by flowing over a barrier rather than by an equilibration of Femi Levels of the FD and OD nodes, no equilibrium is ever reached, and the reset process is thus incomplete. It is well known that the incomplete reset of charge detection nodes causes many artifacts in the sensor image. This would be a large drawback for the TPT reset approach that would make it virtually unusable in many high performance-imaging applications. Fortunately, the well-known CDS signal processing technique, which was developed to minimize kTC noise, is also effective here and efficiently removes all the artifacts of the incomplete reset. Further, more the CDS technique can be extended to any charge detection circuit that has the reset time constant comparable to the reset time period.

In another embodiment of the invention, the FD node is replaced by a CCD well that exists, for example, under the Floating Gate charge detection node and the PT reset is used to remove charge from this well. In this case the charge removal from the well is complete and no CDS signal processing has to be used.

The TPT reset technique thus allows design of high performance charge detection systems that are free of all artifacts, have high charge conversion factors, small reset feed through, and high dynamic range. The high dynamic range results from the large available output signal swing that is not reduced by the reset feed through, as is the case, for example, in conventional FD charge detection structures.

BRIEF DESCRIPTION OF DRAWINGS

The invention will be described in detail in the following description of preferred embodiments with references to the following figures wherein.

DETAILED DESCRIPTION OF PREFERRED EMBODIMENTS

Figure 1:
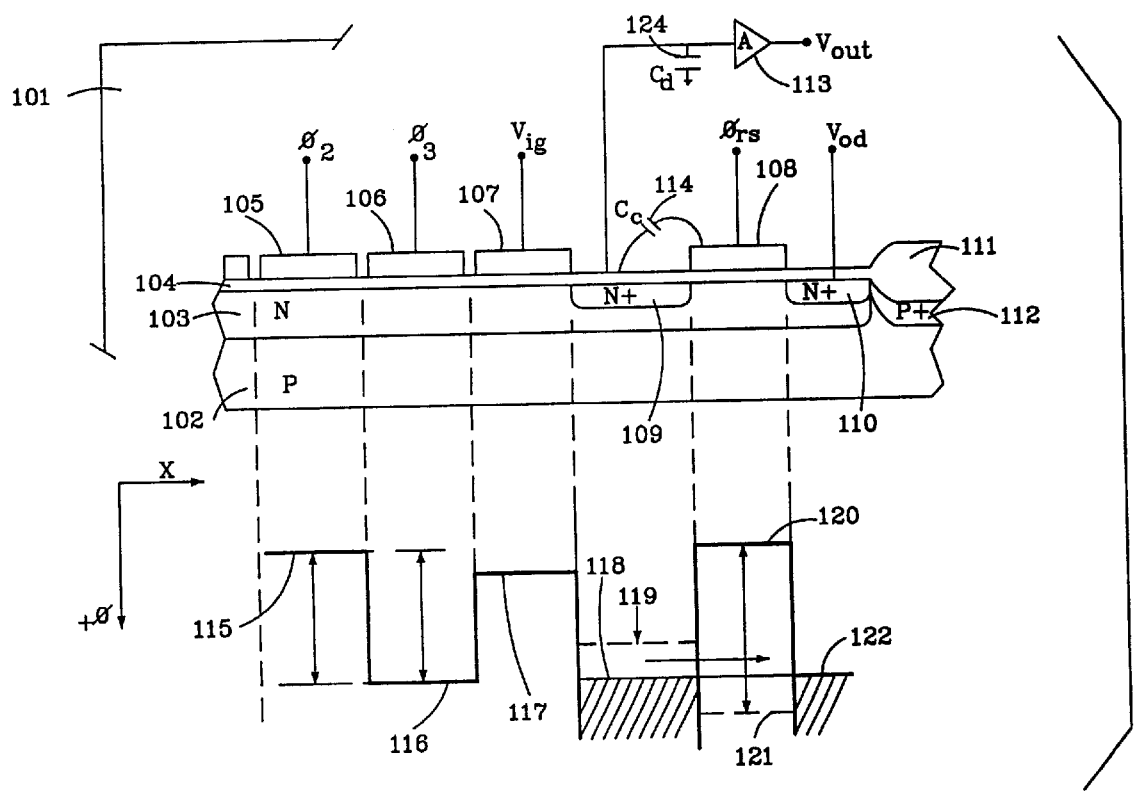
FIG. 1 is a schematic cross section of a typical prior art FD charge detection structure showing the reset gate and its coupling capacitance Cc to the n+ FD node that causes the large reset feed through, and device potential profiles for various gate biases.

In FIG. 1, a cross section 101 of a typical prior art state of the art FD charge detection node is shown. The p type semiconductor substrate 102 has an n type region 103, called buried channel, implanted or diffused near its surface. The n+ junction 109 represents the FD region and the second n+ junction 110 represents the Output Diode region. A thin gate oxide dielectric layer 104 isolates the device gate structure from the substrate. The gate structure consists of several CCD gates 105, 106, and 107, that transport charge to the FD node. The reset gate 108 provides the node reset. The device is further laterally isolated from other devices built on the same substrate by a thick field oxide region 111 with an isolation p+ type doped region 112 underneath. Regions 111 and 112 always completely surround every active device on the substrate. When suitable biases and clocking pulses are applied to the CCD gates, charge 119 is transported through the CCD register and is finally stored in the FD potential well. The drawing represents a portion of the typical multiphase CCD register with only phases 2 and 3 visible. Gate 107 represents the FD input gate, which is DC biased by a suitable voltage $V_{ig}$ and is not clocked. When clocking pulses are applied to the gates, potential within the silicon under these gates changes, as indicated in FIG. 1. The level 115 corresponds to the low gate bias while the level 116 corresponds to the high gate bias. An amplifier 113 senses the arrival of charge 119 on the FD node, which causes a change in its potential. The potential change after amplification and buffering is finally delivered to the amplifier output terminal and may be used for further processing. During charge sensing interval the reset gate is biased at its lowest bias forming a potential barrier 120 underneath. This prevents charge from escaping into the OD region 110. When charge sensing is completed, a short high gate bias clock pulse is applied to the reset gate 108, which resets the FD node. The reset pulse causes a momentary lowering of the potential barrier 120 by changing it to a new level 121, thus allowing equilibration of the FD level 118 with the OD level 122. This action completely removes charge 119 from the FD well, and transports it into the OD. The above description, however, explains only a first order conceptual operation of the FD charge sensing and reset operations. In practice the details of the operation are more complex, but can be reasonably well modeled using a suitable equivalent capacitor circuit model. The FD is connected to the amplifier 113, and together, with its own capacitance and the amplifier input capacitance, forms a node capacitance Cd 124. The coupling capacitance Cc 114 represents the coupling of the reset gate 108 to the FD node 109. From the simple circuit theory, it follows that the pulse applied to the reset gate will appear at the FD detection node attenuated by an approximate factor F=Cc/(Cc+Cd). This is the major source of reset feed through signal.

In modern high sensitivity Image Sensors, it is desirable to lower the node capacitance Cd as much as possible. However, the coupling capacitance Cc cannot be proportionately reduced due to the photolithography limit and other constraints. This fact then leads to a significant increase of the above-derived F factor, which means that, in addition to the signal, there is also a significant feed through present on the FD node. In some cases, the feed through actually exceeds the maximum signal generated by CCD charge. This causes problems in the subsequent signal processing circuitry and finally results in increased noise and a significant loss of Dynamic Range.

Figure 2:
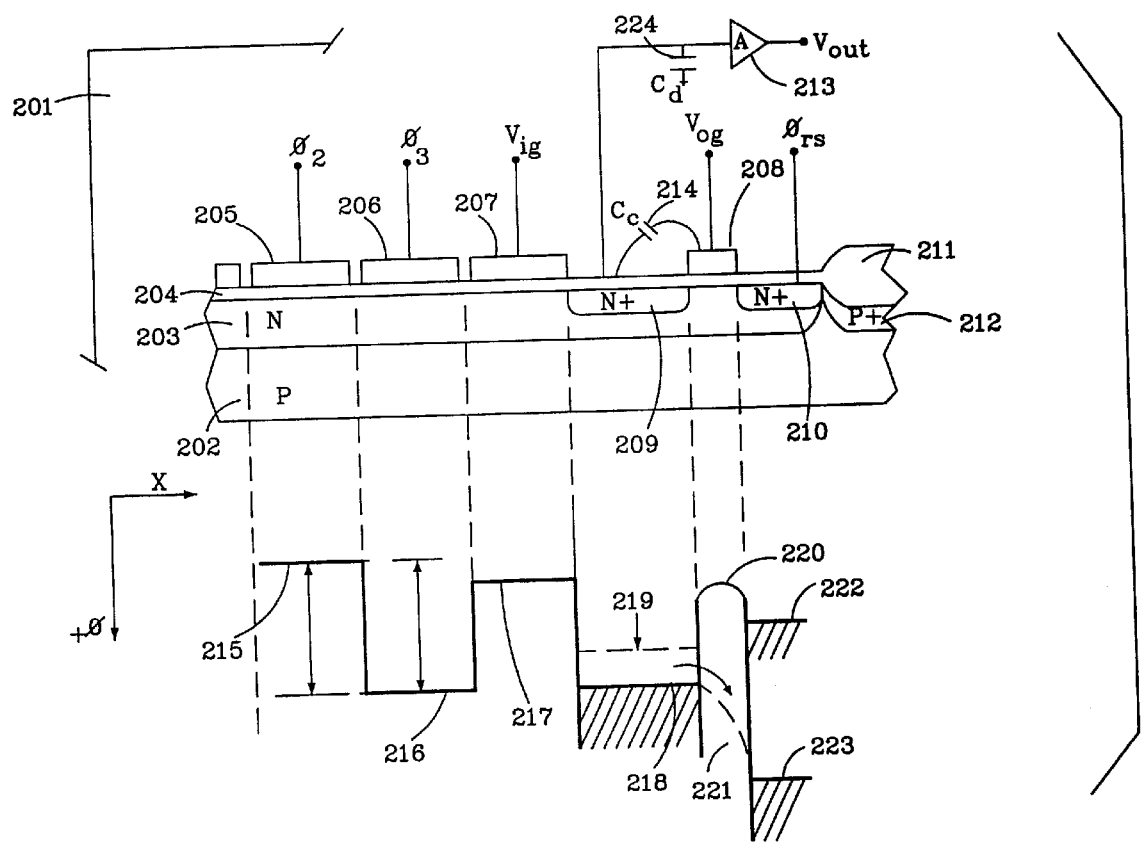
FIG. 2 is a schematic cross section of one embodiment of the present invention where the TPT transistor is used and where the reset pulses are applied to the transistor drain, and device potential profiles for various gate biases are shown.

FIG. 2 represents a cross section 201 of one of the embodiments of the present invention. The cross section is virtually identical to the prior art device cross section introduced in FIG. 1. The details 202 through 219, 222 and 224 correspond directly to the same details 102 through 119, 122 and 124 in FIG. 1. The main differences, however, are in the length of the gate 208 and in the applied biases and clocking signals. The length of the gate 208 is now very short. This causes the potential barrier under this gate to be affected by the bias on the OD. Gate 208 is not pulsed now but is held at a constant bias, for example ground. The reset pulse is applied to the OD instead to the transistor gate. Pulsing the OD causes the potential barrier to be momentarily lowered from level 220 to level 221. This allows charge 219 to flow out from the FD node and reset it. The operating mode of a transistor, when applying voltage to its drain rather then to its gate to turn it on, is called the Punch Through (PT) mode. As can now be clearly observed, there is significantly less chance for the reset pulse coupling from the OD to the FD node. The gate 208 is held at a constant bias and thus does not introduce any pulse signal through its coupling capacitance Cc to the FD node. It provides an effective reset pulse feed through shielding. Unfortunately, there is a significant difference in the charge removal process between the standard and the PT resets. In the standard, case the reset level 118 of the FD is determined only by the OD level 122 and is independent of the amount of charge collected in the FD well. In the PT case, the reset level is determined by the level 221, which is not directly related to either the level 222 or level 223. The reset level 218 is therefore not determined precisely and in addition it also depends on the initial amount of charge present in the FD well before reset. The reset level 218 thus fluctuates from pixel to pixel and must be sampled every time to establish a new reference from which to read the signal. The concept of sampling both the reference and the signal in each pixel is called Correlated Double Sampling (CDS) and has been developed previously to minimize the undesirable effects of kTC noise on the signal. For more details see, for example, the U.S. Pat. No. 3,781,574 to White. The CDS readout technique thus must always be used in conjunction with the TPT reset to extract the correct value of the signal from the FD charge detection node.

Figure 3:
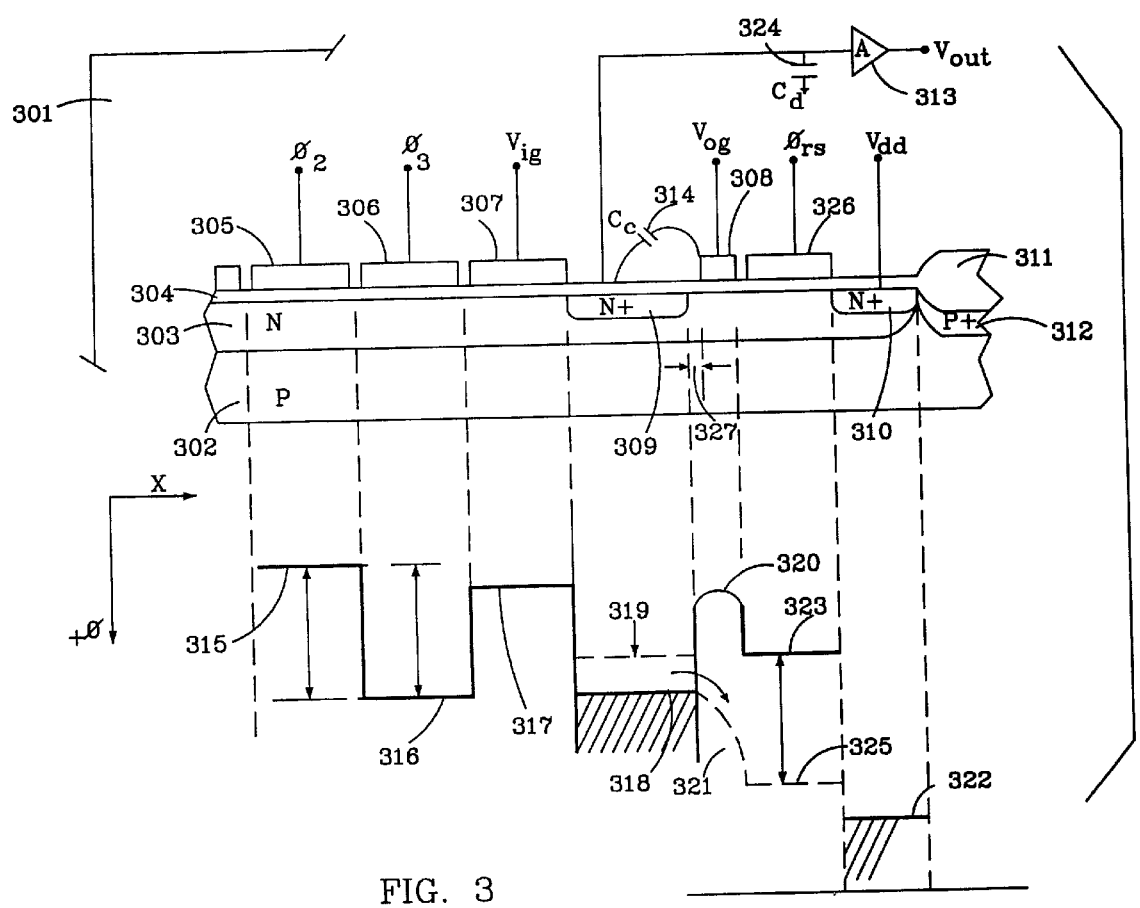
FIG. 3 is a schematic cross section of another embodiment of the present invention where the TPT transistor has a dual gate structure and where the reset pulses are applied to the second, longer, gate while the first gate and the drain are held at suitable DC biases, and the device potential profiles for various gate biases are shown.

FIG. 3 represents another embodiment 301 of the present invention. It is not always easy to control the effective electrical channel length of the PT transistor, in particular, when it is very short. The effective channel length does not only depend on the physical length of the gate 208 but also depends on the lateral diffusions of the FD and OD regions, 209 and 210. To minimize the problems associated with the transistor channel length control, a new device modification has been developed as is detailed in the device cross-section 301 shown in FIG. 3. In this figure, the details 302 through 322 and 324 correspond again directly to the details 202 through 222, and 224 shown in FIG. 2. The main improvements of this embodiment reside in the addition of the reset gate 326 adjacent to the gate 308, and in the creation of a small space 327 between the FD and the gate 308 edges. These improvements prevent the lateral diffusions of the regions 309 and 310 to influence the electrical gate length of the PT transistor. The gate 308 thus more precisely defines the electrical transistor gate length and therefore substantially improves the potential control of the Punch Through process. The PT transistor gate length can thus be very small, for example, in the sub micron region, on the order of 0.2 um. The gate can be formed as indicated in FIG. 3, next to the gate 326, or it can also partially overlap it. Gate overlaps are common in the multiple gate CCD technologies.

The drawings shown in FIG. 1 through FIG. 3 do not necessarily indicate the actual physical gate constructions, which may include the gate overlaps as well as various inter-level oxide layers and insulators. These details are well known to those skilled in the art and will not be discussed here any further. The operation of the device shown in FIG. 3 is very similar to the operation of the device shown in FIG. 2. The gate 308 is again held at a DC bias, preferably ground, and the reset pulse is now applied to the new reset gate 326. The OD is also kept at a DC bias, preferably Vdd. The momentary application of the reset pulse to the gate 326 causes the potential under this gate to change from the level 323 to a new level 325. Consequently, this causes the potential barrier 320 to momentarily change to the level 321 and to remove charge 319 from the FD well. This process thus accomplishes the node reset in the same way as previously described for the device shown in FIG. 2. The reset is again incomplete with a fluctuating reset level and the CDS signal-processing technique must again be used to recover the undistorted signal from the FD node.

Figure 4:
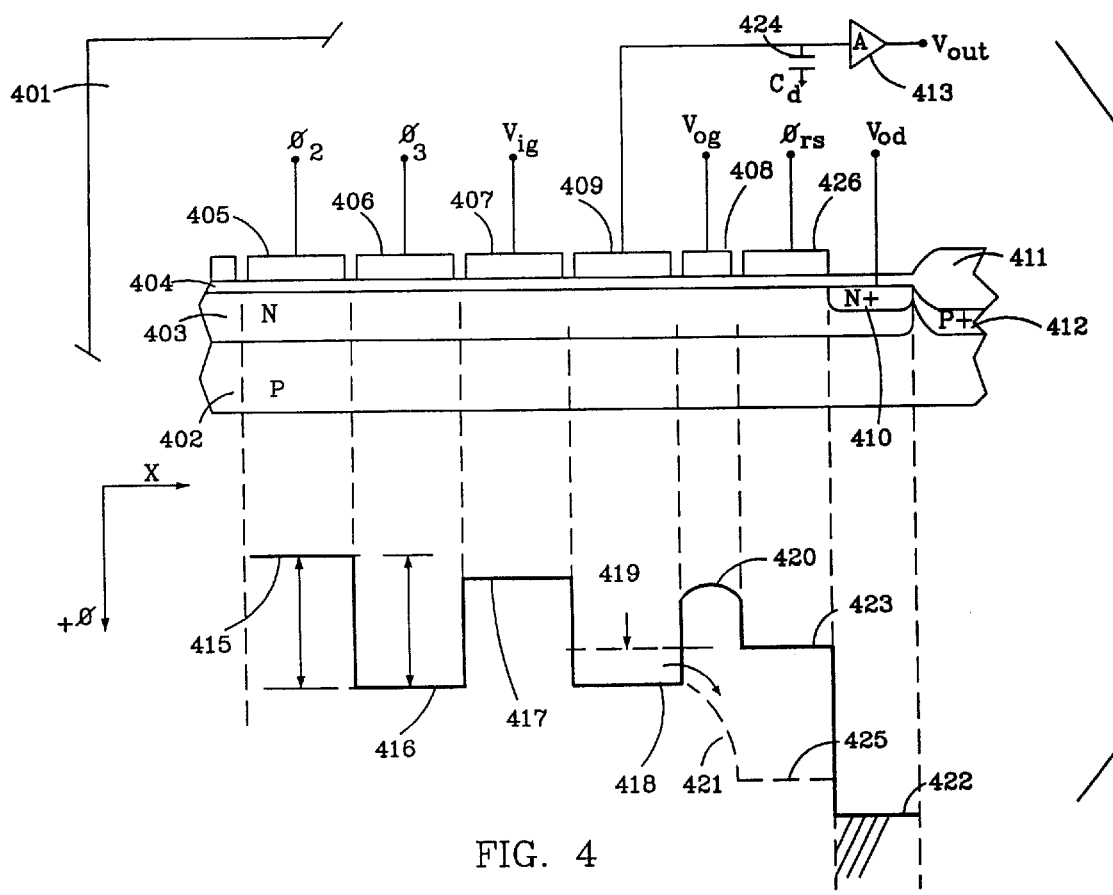
FIG. 4 is a schematic cross section of yet another embodiment of the present invention where the PT transistor has a dual gate structure, where the reset pulses are applied to the second, longer, gate, and where the FD n+ node region was replaced by a well formed under a CCD Floating Gate structure, and the device potential profiles for various gate biases are shown.

FIG. 4 represents yet another embodiment 401 of the present invention. In this structure, the n+ FD charge detection node 309 shown in FIG. 3 was replaced by a Floating Gate node 409. All other details 302 through 325 in FIG. 3 correspond directly to the same details 402 through 425 in FIG. 4. Charge 419 is collected in the well 418 under the FG and is sensed by a potential change of the gate. Charge is removed from the well 418 the same way as in the case 301 by applying a short reset pulse to the gate 426. This action momentarily lowers the potential barrier from the level 420 to the level 421 and thus allows charge 419 to flow out. Since the well region under the FG now does not contain any n+ type diffusion, its potential minimum 418 is determined only by the buried channel doping and by the bias of the FG gate. The potential barrier minimum 421 no longer sets the level 418 and, as a consequence, the charge removal from the well is complete. The complete charge removal does not generate kTC noise and therefore no CDS signal processing technique needs to be used. This feature is important when fast charge readout systems are needed and the CDS technique cannot be used. The FG bias, however, needs to be established by some suitable biasing means, which are not shown in the drawing. Many techniques of how to properly bias the FG are known by those skilled in the art and will not be discussed here since they do not belong to the scope of this patent.

Figure 5:
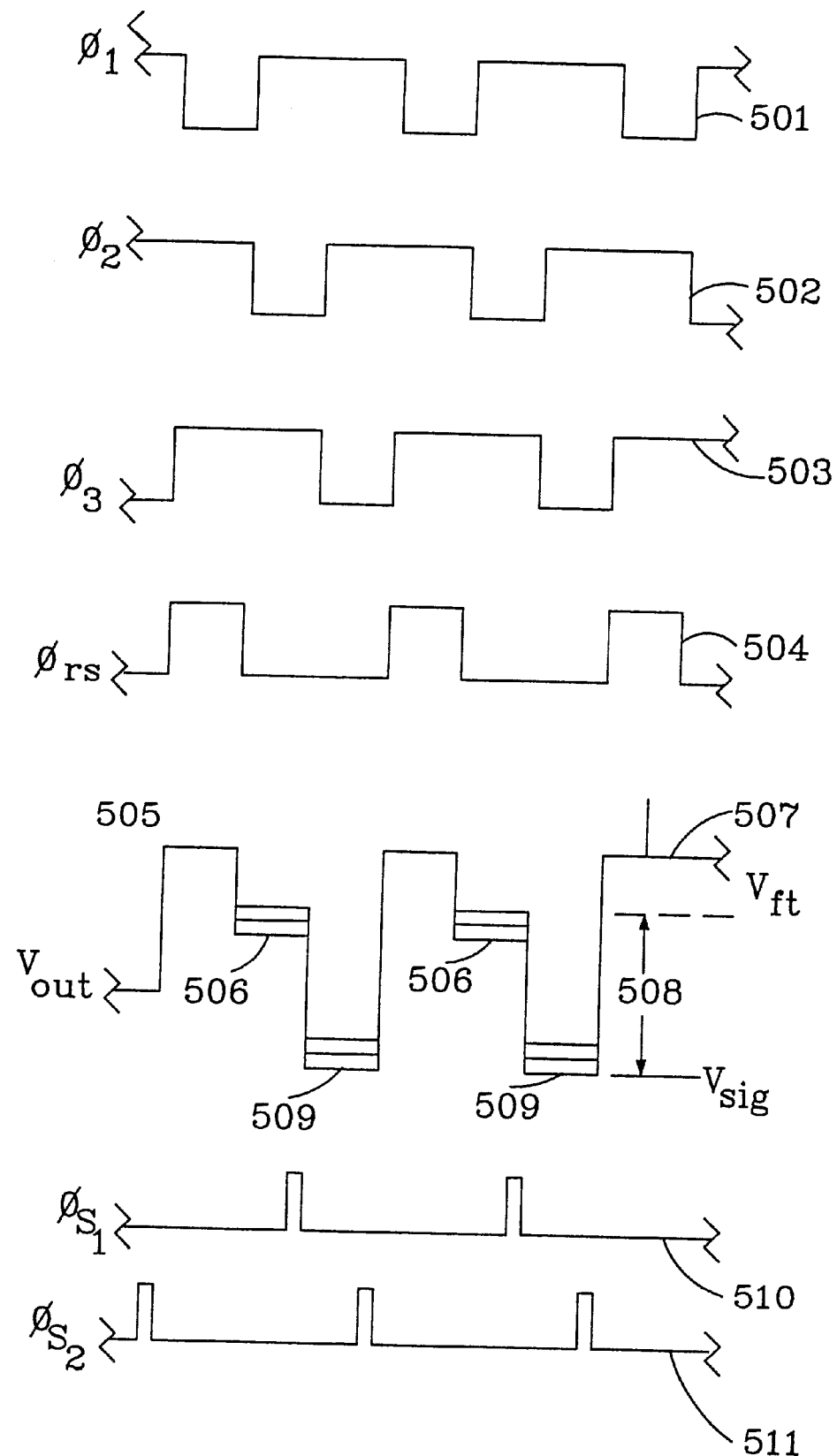
FIG. 5 shows a schematic timing diagram for operating the devices of present invention, and shows a typical output waveform and the detail position of sampling pulses that are used when the CDS signal detection technique must be implemented.

For more clarity, a timing diagram describing pulses applied to the various gates of the invention embodiments is shown in FIG. 5. The waveforms 501, 502 and 503 represent the clocking signals applied to the phases of a typical 3-phase CCD register shown in the drawings in FIG. 1 through FIG. 4. It is clear to those skilled in the art that other CCD registers such as 4-phase, 2-phase or even the single phase (Virtual Phase) can equally be used. The timing diagram modifications that apply to these structures will not be included here since they are easily created and understood by those skilled in the art. The important point here, however, is the relation of negative going transition of the waveform 503 and the positive going reset pulse 504. The negative transitions of the waveform 503 transport charge into the FD or FG detection nodes and generates the negative output signal excursion to the level 509. The reset pulse 504 resets the FD or FG nodes and establishes the reset level 506. The residual reset pulse feed through 505 now consumes much smaller portion 507 of the total available output swing. A larger portion 508 is thus allocated for the signal, which significantly improves the DR of the sensor. As explained earlier the reset level 506 is not stable when the FD node is used and changes from pixel to pixel. The waveforms 510 and 511 then represent the position of sampling pulses used in the CDS double sampling technique to recover the undistorted signal from the TPT reset FD node. When the FG charge detection node is used instead of the FD node, the pulses 520 are not needed since the levels 506 are stable and not fluctuating. The signal can be conveniently sampled by using only pulses 511.

Figure 6:
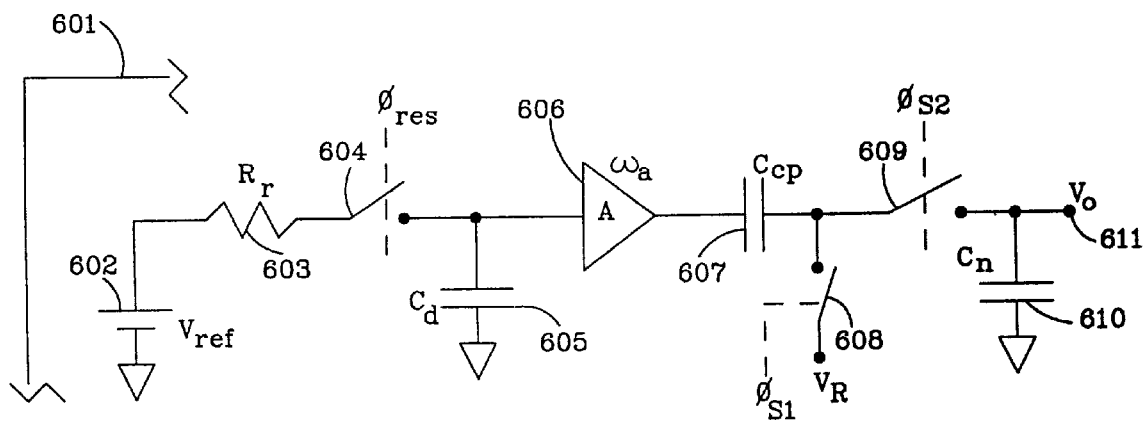
FIG. 6 shows a schematic diagram of a typical CDS circuit with an incomplete reset simulated by a large reset resistor Rr where the resulting reset time constant Rr*Cd is comparable to the reset time period.

To explain more clearly the operation of CDS signal-processing method as it applies to the FD with TPT reset, a simplified circuit diagram 601 is shown in FIG. 6. The charge detection node is represented by an equivalent capacitance Cd 605. The Punch Through reset is represented by a switch 604 with a large reset resistor 603 connected in series with the switch and further connected to a reference voltage source Vref 602. In standard FD transistor reset circuits resistor 604 is usually very small, and its effects on the circuit operation are completely neglected. In particular the Rr*Cd time constant is always much smaller then the reset interval Tr. The following condition; Rr*Cd<<Tr, always holds. In the TPT reset on the other hand, it is considered that the Rr*Cd time constant is comparable to the reset interval. The following range of values can typically apply: $0.01*Tr<Rr*Cd<100*Tr$. The reason why the large reset time constant is not used in standard cases is to avoid incomplete reset. However, since the CDS signal processing method is effective in removing kTC noise, it is just as effective in removing the artifacts of incomplete reset. It is thus another embodiment of this invention that the FD charge detection node can be reset through a large equivalent resistor Rr connected in series with the reset switch. The large value of resistor Rr simulates here only the incomplete nature of the reset; it may or may not be physically present in the device. The detection node capacitor is coupled to high input impedance amplifier 606 that has a bandwidth $\omega_a$. The amplifier output is coupled through a capacitor 607 Ccp to a clamping switch 608. When the switch 608 is pulsed on, as indicated by the clock signal 510 in FIG. 5, capacitor 607 is charged to level 506. When the sampling switch 609 is subsequently pulsed, the level 506 is subtracted from the signal and only the difference between the levels 506 and 509 is stored on the holding capacitor 610 Ch. Here it was assumed that Ch is much smaller than Ccp. The output signal that appears on the node 611 is then further buffered and amplified before it is delivered to the device output terminals. It is clear that the CDS circuit does not care whether the instability of level 506 is caused by kTC noise or by the incomplete reset. It will always be removed and only the true charge induced signal detected. There are many other implementations of the CDS technique possible and are known in the art. Some are based on differential analog sensing, others on digital concepts. It is not within the scope of this disclosure to discuss them here. The key points that are addressed here, however, are: the reset time constant can have a value comparable to the reset time period Tr, and consequently, the reset can be incomplete as for example in the Punch Through reset method.

Having described preferred embodiments of a novel semiconductor image sensor readout concept with low reset feed through and high DR, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A CCD image sensor with high Dynamic Range and low reset feed through, including:
    a transistor, having a gate, operating in a Punch Through Mode;
    at least one n+ diffused region under said gate, said n+ diffused region receiving reset pulses causing Punch Through under the gate to reset an image sensor charge detection node.

2. The CCD image sensor according to claim 1, said transistor having at least two gates, a second gate being shorter than a first gate.

3. The CCD image sensor according to claim 2, wherein said first longer gate, adjacent to the shorter gate, receives reset pulses causing Punch-Through under the shorter gate, said transistor having at least one n+ type diffused region that is maintained at a positive DC bias.

4. The CCD image sensor according to claim 1, wherein said sensor operating in a charge detection mode is reset by said transistor operating in a Punch Through Mode, and said charge detection node has a Floating Diffusion configuration.

5. The CCD image sensor according to claim 4, wherein the said charge detection node has a Floating Gate configuration.

6. The CCD image sensor according to claim 1, wherein the charge detection node has a Floating Diffusion configuration, and wherein a Correlated Double Sampling signal processing technique is used to remove undesirable artifacts caused by an incomplete reset time.

7. The CCD image sensor according to claim 6, wherein the Correlated Double Sampling signal processing technique applied to the Floating Diffusion charge detection node configuration, and where the reset time is comparable to the reset period.

8. An CCD image sensor with high Dynamic Range and low reset feed through, including:
    a transistor, having at least two gates, operating in a Punch Through Mode;
    at least one n+ diffused region under one of said two gates, said n+ diffused region receiving reset pulses causing Punch through under the gate to reset an image sensor charge detection node.

9. The CCD image sensor according to claim 8, wherein a first of said gates is a longer gate, adjacent to a second shorter gate, receives reset pulses causing Punch-Through under the shorter gate, said transistor having at least one n+ type diffused region that is maintained at a positive DC bias.

10. The CCD image sensor according to claim 8, wherein said sensor operating in a charge detection mode is reset by said transistor operating in a Punch Through Mode, and said charge detection node has a Floating Diffusion configuration.

11. The CCD image sensor according to claim 10, wherein said charge detection node has a Floating Gate configuration.

12. The CCD image sensor according to claim 8, wherein the charge detection node has a Floating Diffusion configuration, and wherein a Correlated Double Sampling signal processing technique is used to remove undesirable artifacts caused by an incomplete reset time.

13. The CCD image sensor according to claim 12, wherein the Correlated Double Sampling signal processing technique applied to the Floating Diffusion charge detection node configuration, and where the reset time is comparable to the reset period.

14. An CCD image sensor with high Dynamic Range and low reset feed through, including:
    a transistor, having at least two gates, operating in a Punch Through Mode;
    at least one n+ diffused region under one of said two gates, said n+ diffused region receiving reset pulses causing Punch Through under the gate to reset an image sensor charge detection node; and
    wherein a first of said gates is a longer gate, adjacent to a second shorter gate, receives reset pulses causing Punch-Through under the shorter gate, said transistor having at least one n+ type diffused region that is maintained at a positive DC bias.

* * * * *